US010104800B2

(12) United States Patent
Sampath et al.

(10) Patent No.: US 10,104,800 B2
(45) Date of Patent: Oct. 16, 2018

(54) ADJUSTABLE SNAP-IN RAIL ASSEMBLY FOR STORAGE RACK

(71) Applicant: Oracle International Corporation, Redwood City, CA (US)

(72) Inventors: Ramanan Sampath, Santa Clara, CA (US); Tina Vazirizad, Santa Clara, CA (US); Yefim Gelfond, Danville, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 15/450,097

(22) Filed: Mar. 6, 2017

(65) Prior Publication Data
US 2017/0181313 A1    Jun. 22, 2017

Related U.S. Application Data

(62) Division of application No. 14/725,336, filed on May 29, 2015, now Pat. No. 9,629,276.

(51) Int. Cl.
*H05K 7/14* (2006.01)
*A47B 96/14* (2006.01)
*H05K 7/18* (2006.01)

(52) U.S. Cl.
CPC ....... *H05K 7/1489* (2013.01); *A47B 96/1441* (2013.01); *H05K 7/183* (2013.01)

(58) Field of Classification Search
CPC ..... A47B 88/044; A47B 88/10; A47B 88/047; A47B 88/08; A47B 2088/0444; A47B 2210/0081; A47B 2210/0059; A47B 2210/0054; A47B 96/1441; H05K 7/1489; H05K 7/1421; H05K 7/183
USPC ........... 211/26; 312/334.4, 334.5, 334.6, 333
See application file for complete search history.

(56) References Cited

U.S. PATENT DOCUMENTS

| | | |
|---|---|---|
| 971,997 A | 10/1910 | Henning |
| 987,960 A | 3/1911 | Connors |
| 1,419,748 A | 6/1922 | Miller |
| 1,887,495 A | 11/1932 | Carter, Jr. |
| 3,016,103 A | 1/1962 | Studer |
| 3,874,244 A | 4/1975 | Rasmussen et al. |
| 4,147,231 A | 4/1979 | Chantler et al. |
| 5,100,092 A | 3/1992 | Sovis |
| 5,275,437 A | 1/1994 | Modinger et al. |
| 5,678,656 A | 10/1997 | Lanzafame |

(Continued)

*Primary Examiner* — Patrick D Hawn
(74) *Attorney, Agent, or Firm* — Marsh Fischmann & Breyfogle LLP; Jonathon A. Szumny

(57) ABSTRACT

A rail assembly for a storage rack that includes, in one aspect, a first rail member, a second rail member, and a nut assembly slidably mounted to the second rail member. The first rail member may include a first mounting aperture extending through a body of the first rail member and the second rail member may include a first mounting slot extending through a body of the second rail member for a predefined dimension along a longitudinal axis. The sliding nut assembly may be slidably mounted adjacent the first mounting slot to a longitudinal position aligned with the first mounting aperture such that a fastener may be received through the first mounting aperture and first mounting slot and threaded into the first nut assembly to lock the first and second rack members against relative movement and fix the rail assembly to the front and rear pillars.

16 Claims, 11 Drawing Sheets

(56) References Cited

U.S. PATENT DOCUMENTS

| | | | |
|---|---|---|---|
| 6,181,549 B1 | 1/2001 | Mills | |
| 6,230,903 B1* | 5/2001 | Abbott | A47B 88/43 211/190 |
| 6,401,866 B1 | 6/2002 | Roy | |
| 6,422,399 B1* | 7/2002 | Castillo | A47B 57/40 211/175 |
| 6,450,600 B1 | 9/2002 | Chen et al. | |
| 6,462,670 B1 | 10/2002 | Bolognia et al. | |
| 6,554,142 B2* | 4/2003 | Gray | A47B 57/30 211/175 |
| 6,578,939 B1* | 6/2003 | Mayer | A47B 88/49 312/334.5 |
| 6,585,336 B2 | 7/2003 | Munday et al. | |
| 6,622,873 B2 | 9/2003 | Hegrenes et al. | |
| 6,644,480 B2 | 11/2003 | Kaminski | |
| 6,666,340 B2 | 12/2003 | Basinger et al. | |
| 6,681,942 B2 | 1/2004 | Haney | |
| 6,702,124 B2* | 3/2004 | Lauchner | A47B 88/43 211/192 |
| 6,736,277 B2* | 5/2004 | Lauchner | A47B 88/43 211/175 |
| 6,830,300 B2* | 12/2004 | Lauchner | A47B 88/43 312/223.1 |
| 6,871,897 B1 | 3/2005 | Synder | |
| 6,962,397 B2 | 11/2005 | Dobler et al. | |
| 6,974,037 B2* | 12/2005 | Haney | H05K 7/1421 211/183 |
| 6,997,611 B2 | 2/2006 | Chen et al. | |
| 7,090,281 B2 | 8/2006 | Davey et al. | |
| 7,137,512 B2 | 11/2006 | Nguyen et al. | |
| 7,210,198 B2 | 5/2007 | Hoshide et al. | |
| 7,255,409 B2 | 8/2007 | Hu et al. | |
| 7,357,468 B2 | 4/2008 | Hwang et al. | |
| 7,399,041 B2 | 7/2008 | Prentner et al. | |
| 7,404,611 B1 | 7/2008 | Que | |
| 7,431,410 B2 | 10/2008 | Sato et al. | |
| 7,549,712 B2 | 6/2009 | Booker et al. | |
| 7,699,415 B2 | 4/2010 | Tseng et al. | |
| 7,798,339 B2 | 9/2010 | Brooks et al. | |
| 8,104,851 B2* | 1/2012 | Lu | H05K 7/1489 312/334.5 |
| 8,118,178 B2* | 2/2012 | Olesiewicz | H05K 7/183 211/26 |
| 8,292,382 B2* | 10/2012 | Cheng | H05K 7/1489 312/334.4 |
| 8,967,744 B2* | 3/2015 | Chen | H05K 7/1489 211/26 |
| 2001/0040142 A1 | 11/2001 | Haney | |
| 2002/0084143 A1 | 7/2002 | Roy | |
| 2003/0141264 A1 | 7/2003 | Kaminski | |
| 2003/0189395 A1 | 10/2003 | Doornbos et al. | |
| 2004/0080246 A1 | 4/2004 | Mlchaels | |
| 2005/0017613 A1 | 1/2005 | Cirocco et al. | |
| 2005/0162052 A1 | 7/2005 | Chen et al. | |
| 2005/0218759 A1 | 10/2005 | Kobayashi et al. | |
| 2005/0225114 A1 | 10/2005 | Davey et al. | |
| 2007/0175835 A1* | 8/2007 | Liang | H05K 7/1489 211/26 |
| 2008/0073469 A1 | 3/2008 | Mushan et al. | |
| 2008/0087788 A1 | 4/2008 | Cheng et al. | |
| 2008/0164795 A1 | 7/2008 | Peng et al. | |
| 2011/0037362 A1 | 2/2011 | Park et al. | |

* cited by examiner

ADJUSTABLE SNAP-IN RAIL ASSEMBLY FOR STORAGE RACK

RELATED APPLICATIONS

This application is a divisional of U.S. application Ser. No. 14/725,336, entitled "ADJUSTABLE SNAP-IN RAIL ASSEMBLY FOR STORAGE RACK," and filed on May 29, 2015, the entire contents of which are incorporated herein in its entirety as if set forth in full.

BACKGROUND

1. Field of the Invention

The present invention generally relates to storage racks (e.g., cabinets) for computing devices such as servers, and more particularly to adjustable rail assemblies for storage racks that can accommodate differing front to rear pillar spacing among storage racks.

2. Relevant Background

Servers and other computing devices are often stored in cabinets or racks. Each of these cabinets or racks may contain numerous servers in a stacked or side-by-side arrangement. For example, a server cabinet may house 5 to 10 servers behind each door. It is desirable for each server to be installed and/or serviced without affecting operation of the other servers, and, in many cases, it is desirable for each server to be maintained or accessed without disconnecting it from power or communications/network links (e.g., to provide hot swappable and maintainable servers in an enterprise or data center environment).

To this end, each server is typically mounted within the cabinet or storage rack using a rail, slide or rack-mount kit. A rail kit typically includes a pair of outer rail assemblies, each of which is attached to front and rear vertical support members or pillars (e.g., Radio Electronics Television Manufacturers Association ("RETMA") rails) of the storage rack frame and extends horizontally to define a server mounting location within the storage rack or cabinet. Generally, a storage rack includes a pair of front pillars adjacent a front door or opening of the storage rack and a pair of rear pillars spaced from the front pillars, where a rear door or opening of the storage rack is typically spaced from the rear pillars (e.g., so that a space or gap exists between the rear door/opening and the rear pillars of the storage rack).

Each outer rail assembly is often mated with or otherwise interconnected with a middle rail or middle member of the rail kit, where the middle rail is supported within an inner channel or groove of the outer rail assembly and may be positioned by sliding within the outer rail assembly between retracted and extended positions. In the extended position, the middle rails typically extend outward from the ends of the outer rail assemblies several inches to a foot or more to allow access to an attached or supported server or other computing device. In the retracted position, the middle rail has its outer end positioned within the outer rail.

To mount a server in the rack, a pair of inner or rack rails is attached to an outer surface of a server (or other computer device) chassis, and each of the inner or rack rails is coupled with or otherwise interconnected to a corresponding one of the middle members or rails. Generally, a server is mounted within the server storage rack by extending out the middle rail, aligning the ends of the both of the inner or rack rails on the server chassis with the ends of the middle rails, and, once proper alignment is achieved on both sides, pushing on the server chassis to cause the inner rails or racks to mate or couple with the middle members or rails (e.g., in a tongue-and-groove manner) as the inner rails slide within channels or grooves of the middle member or rails. Continued pushing then causes the middle member or rail to slide within the outer rail or member from the extended position to the retracted position, which allows the storage rack door to be closed.

As the distance between the front and rear pillars often varies from rack to rack (e.g., due to dimensional tolerances), each outer rail assembly often includes a pair of sliding (e.g., telescoping, nested, etc.) rail members that are respectively configured to engage with a respective front and rear pillar of a storage rack. As an example, some existing outer rail assemblies include first and second sliding rail members having respectively first and second mounting tabs thereon, where one or more mounting pins protrude from each of the first and second mounting tabs. For instance, an operator may slide the first and second rail members relative to each other such that a distance between the first and second mounting tabs is greater than the distance between the outer surfaces of a pair of front and rear pillars. The operator may then slide the first and second rail members relative to each other such that the pins enter or snap into respective openings through the outer surfaces and the first and second mounting tabs clamp about the outer surfaces.

In some arrangements, the operator may slide the first and second rail members relative to each other such that a distance between the first and second mounting tabs is less than the distance between the inner surfaces of a pair of front and rear pillars and then slide the first and second rail members such that the pins enter respective openings through the inner surfaces so that the first and second mounting tabs push against the inner surfaces. In either case, the operator may then fix the first and second rail members relative to each other such as by inserting threaded fasteners through aligned holes through the first and second rail members and threading nuts over ends of the fasteners. In some embodiments, the first and second rail members may be spring loaded to provide a return force that maintains the first and second rail members in their clamped position about the outer surfaces of the front and rear pillars (e.g., or pressed against the inner surfaces of the front and rear pillars).

SUMMARY

Existing outer rail assemblies of storage racks are deficient in a number of regards that complicates manufacturing of the outer rail assemblies, increases the weight of the outer rail assemblies, and the like. For instance, many snap-in rack-side rail systems utilize bulky springs, ratchets, or other locking mechanism that rely upon excessive moving parts that may add undue weight or otherwise be unreliable in various operational conditions. Additionally, such conventional systems may fail to accommodate dimensional variations between a front and rear pillar of a storage rack, thereby limiting the ability of conventional systems to support, for example, a server in a storage rack where fine adjustments in the rail assembly length may be required. Additionally, conventional systems may not provide structural support of a server in the area beyond the rear pillar of a storage rack (e.g., the area between the rear pillar and rear access door of a storage rack), thereby unduly limiting the physical size of a server that may be stored in the storage rack.

In view of the foregoing, a rail assembly is disclosed that is configured to move beyond the basic paradigm of conventional snap-in rack-side rails for use in a computing device storage rack, thereby facilitating the fine adjustment of rail assembly length while structurally supporting a server, for example, over a distance generally extending from a front access door to a rear access door of a storage rack. In this regard, the disclosed rail assembly may be configured to accommodate differing front to rear pillar spacing among storage racks (e.g., due to the dimensional tolerances) in a manner that is light-weight and substantially free from excessive moving parts (e.g., such as springs, ratchets, and other bulky components) that may otherwise add undue weight and be unreliable in various operational conditions.

In one aspect, the present disclosure describes a rail assembly for a computing device storage rack. The rail assembly includes a first rail member with a first body. The first rail member further includes a first mounting tab extending from the first body that may be configured to engage with one of a front or rear vertical pillar of a storage rack. The first rail member further includes at least a first mounting aperture extending through the first body. The rail assembly further includes a second rail member with a second body. The second rail member includes a second mounting tab extending from the second body that may be configured to engage with the other of the front and rear vertical pillar of the storage rack. The second rail member further includes at least a first mounting slot extending through the second body that extends along a longitudinal axis. The second rail member further includes at least a first nut slidably mounted adjacent a first side of the first mounting slot along the longitudinal axis. Notably, the first and second bodies may be slidably attached to each other for movement in first and second opposite directions so that the first aperture may be slidable adjacent an opposite second side of the first slot along the longitudinal axis.

A number of feature refinements and additional features are applicable in the first aspect and contemplated in light of the present disclosure. These feature refinements and additional features may be used individually or in any combination. As such, each of the following features that will be discussed may be, but are not required to be, used with any other feature combinations of the first aspect.

For example, in an embodiment, the rail assembly may further include at least one fastener receivable through the first aperture and the first slot and into the first nut to inhibit sliding movement of the first and second bodies relative to each other and inhibit sliding movement of the first nut relative to the second body. In other instances, the rail assembly may include a sliding nut assembly. In this regard, the sliding nut assembly may include a guide member that is rigidly attached to the second body over the first side of the at least one slot. The sliding nut assembly may also include a carrier member that includes the first nut attached thereto. Notably, the carrier member may be slidable relative to the guide member to slidably position the first nut over the first side of the first slot along the longitudinal axis thereof. Additionally, the guide member may include first and second guiding tracks and the carrier member may include first and second sliding members that may be respectively slidably received in the first and second guiding tracks for sliding movement of the carrier member relative to the guide member. The guide member may also include at least one slot that extends along a longitudinal axis and the carrier member may include at least one aperture that is configured to slide over the at least one slot of the guide member along the longitudinal axis thereof.

In this regard, the sliding nut assembly may further include a pin received through the at least one aperture of the carrier member and the at least one slot of the guide member to constrain sliding movement of the at least one nut to a predefined linear range that substantially corresponds to a length of the at least one slot of the second body along the longitudinal axis thereof. In some instances, a length of the at least one slot of the guide member along the longitudinal axis thereof is approximately equal to the length of the first slot of the second body. In this regard, the first body may further include a second aperture therethrough and the second body may further include a second slot extending therethrough along a longitudinal axis. The carrier member may further include a second nut attached thereto such that the carrier member may be slidable relative to the guide member to simultaneously slidably position the first nut over the first side of the first slot along the longitudinal axis thereof and the second nut over a first side of the second slot along a longitudinal axis thereof.

In another embodiment, the first body may further include a second aperture therethrough and the second body may further include a second slot extending therethrough along a longitudinal axis. In this regard, the second rail member may further include a second nut slidably mounted adjacent a first side of the second mounting slot along the longitudinal axis thereof. The first nut assembly may therefore be slidably mounted adjacent to a first end of the second body and the second nut may be slidably mounted adjacent to a second end of the second body. In some instances, the second body may include a sliding slot therethrough and the first body may include at least one protrusion extending therefrom that may be slidably receivable in the sliding slot on a first side of the sliding slot. Additionally, the rail assembly may further include at least one mounting bracket positionable over an opposite second side of the sliding slot and securable to the at least one protrusion.

In yet another embodiment, the first rail member may include a substantially C-shaped channel and the second rail member may include a substantially C-shaped channel. In this regard, the first and second rail members may slidably interlock to resist relative movement along an axis transverse to the longitudinal axis. Additionally, the first mounting tab may include at least one L-shaped member.

In this regard, a second aspect of the present disclosure includes a method of mounting a rail assembly onto front and rear pillars of the storage rack. The method includes sliding first and second rail members relative to each other so that respective first and second mounting tabs of the first and second rail members engage with front and rear pillars of a storage rack. The method further includes sliding at least a first nut relative to a body of the second rail member so that the first nut aligns with at least a first aperture through a body of the first rail member and at least a first slot through the body of the second rail member. The method further includes inserting at least a first fastener through the first aperture through the body of the first rail member and the first slot through the body of the second rail member. The method further includes threading the first fastener into the first nut to inhibit sliding movement of the first and second rail members relative to each other and inhibit sliding movement of the first nut relative to the body of the second rail member.

A number of feature refinements and additional features are applicable in the second aspect and contemplated in light of the present disclosure. These feature refinements and additional features may be used individually or in any combination. As such, each of the following features that will be discussed may be, but are not required to be, used with any other feature combinations of the second aspect.

For example, the method may further include sliding a second nut relative to the body of the second rail member so that the second nut aligns with a second aperture through the body of the first rail member and a second slot through the body of the second rail member. The method may further include inserting a second fastener through the second aperture through the body of the first rail member and the second slot through the body of the second rail member. The method may further include threading the second fastener into the second nut to inhibit sliding movement of the first and second rail members relative to the body of the second rail member.

In some instances, the foregoing steps of sliding the first and second nuts occur simultaneously. In this regard, the first and second nuts may be mounted on a carrier member that may be slidably attached to the body of the second rail member. Furthermore, the foregoing steps of sliding the first and second nuts includes sliding the carrier member.

In this regard, a third aspect of the present disclosure includes a storage rack for supporting computing devices. The storage rack includes a plurality of front vertical support pillars. The storage rack further includes a plurality of rear support pillars that are spaced from the plurality of front support pillars. The storage rack further includes a plurality of rail assemblies for receiving computing devices. Each rail assembly of the storage rack may interconnect one of the front vertical support pillars to the rear vertical support members. Each rail assembly includes a first rail member having a first body that may be slidably to over a first side of a second body of a second rail member. Each rail assembly further includes a sliding nut assembly that may be mounted to an opposite second side of the second body of the second rail member. In this regard, the sliding nut assembly includes a guide member that may be rigidly attached to the second side of the second body. The sliding nut assembly further includes a carrier member with a nut attached thereto. Notably, the carrier member may be slidable relative to the guide member to slidably position the first nut along the second side of the second body.

A number of feature refinements and additional features are applicable in the third aspect and contemplated in light of the present disclosure. Such contemplated feature refinements and additional features may be used individually or in any combination.

In addition to the exemplary aspects and embodiments described above, further aspects and embodiments will become apparent by reference to the drawings and by study of the following descriptions.

DETAILED DESCRIPTION

Figure 1A:
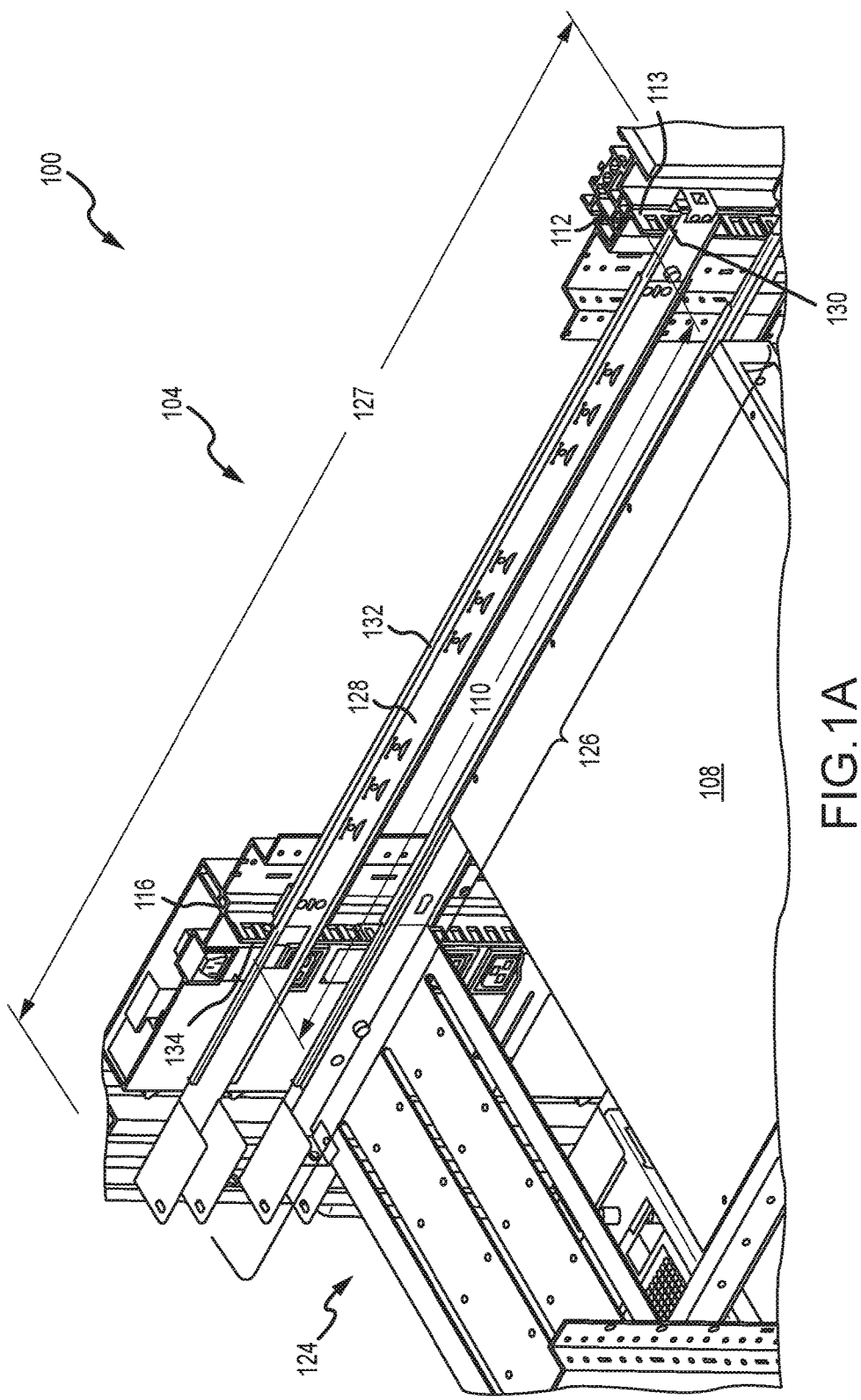
FIGS. 1A-1B depict an embodiment of a storage rack for supporting computing devices via one or more rail assemblies.

Disclosed herein are embodiments related to a rail assembly for a computing device storage rack ("storage rack") and for mounting a rail assembly onto front and rear pillars of a storage rack. In this regard, the disclosed embodiments provide a whole new solution to configuring a storage rack that moves beyond the basic paradigm of conventional snap-in rack-side rails. For example, the disclosed rail assembly may extend beyond the rear pillars of the storage rack to structurally support a server (or other computing devices) in the region beyond the rear pillars (e.g., between the rear pillars and a rear door of the storage rack) while maintaining structural support of the server through connections with the front and rear pillars. Accordingly, the rail assembly may facilitate the housing of physically larger and/or heavier servers in the storage rack than previously possible with conventional systems (e.g., by increasing the area over which a server may be supported within the storage rack). In this regard, the computing capacity of a storage rack may be substantially increased (e.g., by adding larger servers with additional processing capacity, etc.) free of necessarily altering the physical dimensions of the storage rack (e.g., such as the distance between the front and rear pillars). As such, servers housed within an existing storage rack may be upgraded (e.g., replaced with larger units), for example, without increasing the overall storage rack "footprint" (i.e., physical size) in a user's server room.

Furthermore, the disclosed rail assembly is configured to accommodate differing front to rear pillar spacing among storage racks (e.g., due to dimensional tolerances) in a manner that is light-weight and substantially free from excessive moving parts (e.g., such as springs, ratchets, and other bulky components) that may otherwise add undue weight and be unreliable in various operational conditions. As an example, each of first and second rail members of the disclosed assembly may be configured to engage a respective one of the front or rear vertical pillars of the storage rack for supporting a server. For instance, the first and second rail members may be slidably attached to each other for movement in opposite directions such that at least a portion of the first and second rails are disposed in adjacent overlapping relation while engaged with the respective one of the front or rear vertical pillars of the storage rack.

To accommodate front to rear pillar dimensional tolerances, the disclosed rail assembly may include a fastener or fastening member (e.g., nut(s)) that is slidably mounted to one of the first and second rail members over the overlap region and that is configured to engage with a corresponding fastener that passes through the first and second rail member in the overlap region. For example, the first rail member may include a first mounting aperture extending through a body of the first rail member and the second rail member may include a first mounting slot extending through a body of the second rail member for a predefined dimension along a longitudinal axis. The second rail member may further include a first nut or nut assembly slidably mounted adjacent to the first mounting slot for slidable travel over at least the predefined longitudinal dimension of the first mounting slot. In this regard, despite the relative position of the front and rear pillars of the storage rack and the engagement of the first and second rail members therewith, the first nut assembly may slidably travel over the first mounting slot to a longitudinal position that is aligned with the first mounting aperture such that a fastener may be received through the first mounting aperture and the first mounting slot and threaded into the first nut assembly to lock the first and second rack members against relative movement and thereby fix the rail assembly to the front and rear pillars. Stated differently, the first nut assembly may slidably travel to a longitudinal position adjacent to the first mounting slot such that a first nut of the nut assembly is disposed in concentric relation to the first mounting aperture so that a threaded fastener can be inserted through the first aperture and mounting slot and into the nut and tightened to clamp the first and second rail members together.

Reference will now be made to the accompanying drawings, which assist in illustrating the various pertinent features of the various novel aspects of the present disclosure. The following description is presented for purposes of illustration and description. Furthermore, the invention is not intended to limit the inventive aspects to the forms disclosed herein. Consequently, variations and modifications commensurate with the following teachings, and skill and knowledge of the relevant art, are within the scope of the present inventive aspects.

Figure 1B:
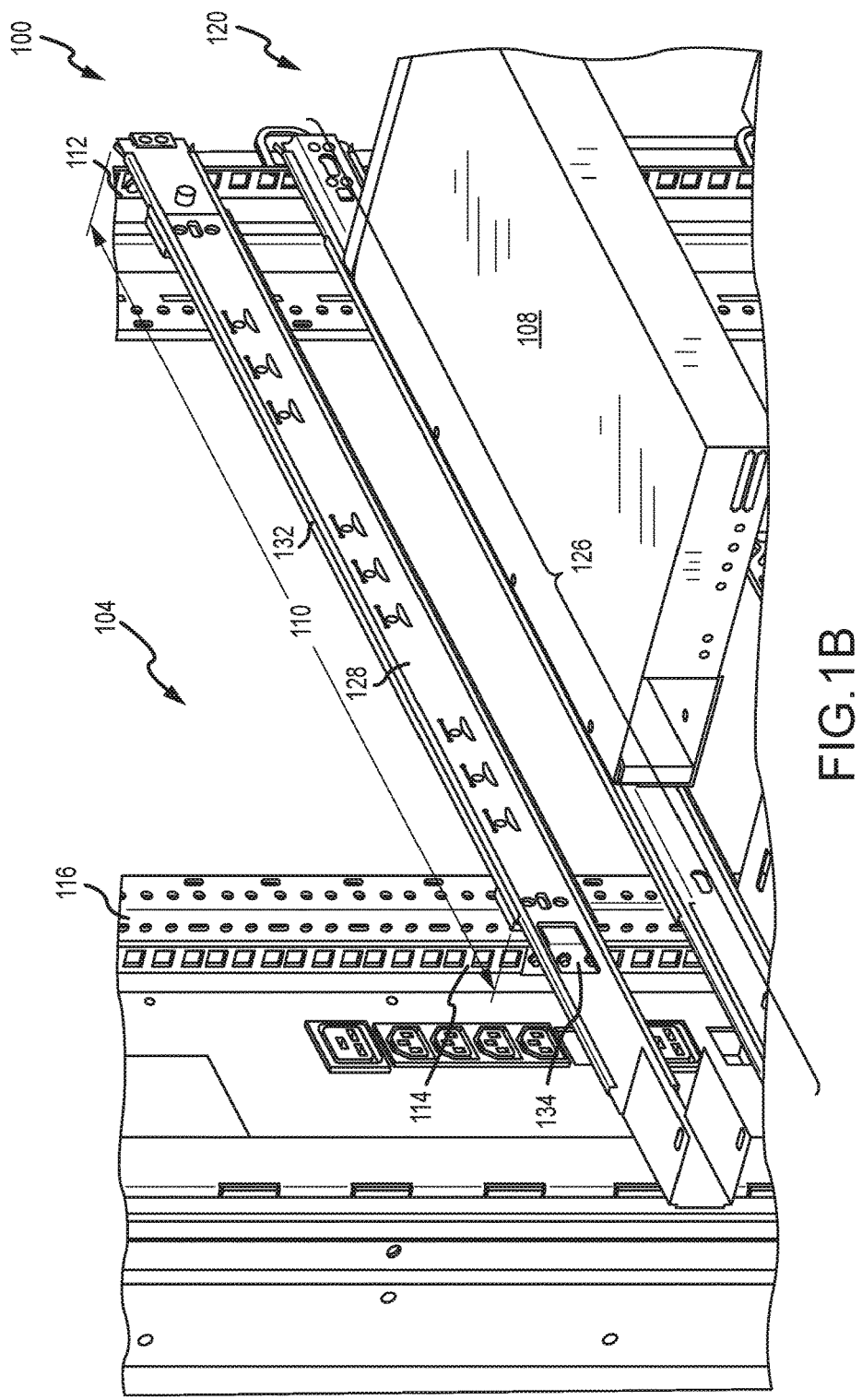

In this regard, FIGS. 1A-1B present an embodiment of a system 100 operable to store one or more servers or other computing devices via a rail assembly 126 as discussed herein. Broadly, the system 100 may include a computer or server storage rack 104 that may support one or more computing devices 108 (e.g., servers, data storage devices, power distribution units (PDUs), etc.). For instance, a number of computing or electronic devices 108 may be mounted on the storage rack 104 in a vertically stacked fashion, although other arrangements (e.g., stacked horizontally) are also envisioned. The storage rack 104 may include a number of vertical support members, such as front and rear vertical pillar members 112, 116 that extend upward from a floor or other platform (not shown) configured to provide structural support for componentry (e.g., computing devices 108, etc.) housed within the storage rack 104. Each of the front and rear vertical pillar members 112, 116 may include front and rear mounting surfaces 113, 114 and may be operable to receive and/or engage with a rail assembly for structurally supporting the computing devices 108, as will be discussed in more detail below. A front to rear pillar spacing distance 110 may separate the front and rear vertical pillar members 112, 116 (i.e., may separate the locations on the front and rear vertical pillar members 112, 116 on which the rail assembly 126 is mounted).

The storage rack 104 may also include a front access opening 120 (see FIG. 1B) through which the computing devices 108 may be retracted and reinserted, and a rear access opening 124 (see FIG. 1A) through which necessary connections may be made to the computing devices 108 (e.g., for coupling the computing devices 108 to external components or to each other, etc.). Although not illustrated, side panels may extend between the front and rear access openings 120, 124 to form an internal volume of the storage rack 104 in which the computing devices 108 may be positioned. Additionally, access doors may be provided over the front and rear access openings 120, 124 to close the storage rack 104 when all of the computing devices 108 are positioned within the rack. Grills or other perforations may be included in any appropriate portion of the storage rack 104 to enhance airflow through the system 100. As will be appreciated, the various components of the storage rack 104 may be formed of metal, plastic, or the like.

Each computing device 108 may be structurally supported within the storage rack 104 via a pair of rail assemblies 126. In this regard, each pair of rail assemblies 126 forms a bay that is operable to receive at least one computing device 108. The rail assemblies 126 may also permit the computing devices 108 to be recessed or inserted into the storage rack 104 or withdrawn from the storage rack 104 for servicing while remaining structurally supported by the rail assemblies 126. The one or more rail assemblies 126 may be mounted to the storage rack 104 at the front and rear vertical pillar members 112, 116 and extend over a rail assembly length 127 defined by the distance generally spanning from the front access opening 120 to the rear access opening 124. In this regard, the rail assembly 126 may structurally support the computing device 108 over an area that includes the area beyond the rear vertical pillar member 116 (e.g., between the rear vertical pillar member 116 and the rear access opening 124), thereby facilitating the housing of a physically larger and/or heavier computing devices 108 in the storage rack 104 (e.g., by increasing the area over which the computing device 108 supported within the storage rack 104).

The rail assembly 126 may also include first and second rail members 128, 132 configured to engage a respective one of the front and rear vertical pillar members 112, 116. As depicted according to the embodiment of FIGS. 1A-1B, the first rail member 128 may engage with the front vertical pillar member 112 via a first mounting tab 130 and the second rail member 132 may engage with the rear vertical pillar member 116 via a second mounting tab 134. The first and second rail members 128, 132 may be slidably attached to each other for movement in opposite directions to facilitate mounting of the first and second mounting tabs 130, 134 on the front and rear vertical pillar members 112, 116. As at least a portion of the first and second rail members 128, 132 are disposed in adjacent overlapping relation while engaged with the front and rear vertical pillar members 112, 116, respectively, the first and second rail members 128, 132 may create a continuous rail assembly 126 that provides structural support for the computing devices 108 over the rail assembly length 127.

As previously stated, the front and rear vertical pillar members 112, 116 may be separated by the front to rear pillar spacing distance 110. As such, when the first and second mounting tabs 130, 134 are separated by a distance equal to the front to rear pillar spacing distance 110, the rail assembly 126 may be supportively engaged with the front and rear vertical pillar members 112, 116 (i.e., the rail assembly 126 may be mounted to the storage rack 104 by the engagement of first and second mounting tabs 130, 134 with the front and rear vertical pillar members 112, 116, respectively). Due at least in part to dimensional tolerances, however, the front to rear pillar spacing distance 110 may be variable (i.e., the precise distance 110 may be different for each respective storage rack, including for storage racks of the same nominal size and/or configuration). As a result, the locking mechanism of some existing rail assemblies may not be able to always accommodate such differences in front to rear pillar spacing.

In this regard, as discussed in greater detail below, the discussed rail assembly 126 may include a fastener or fastening member (e.g., nut or nut assembly) that is slidably mounted to one of the first or second rail members 128, 132, to accommodate such dimensional tolerances of the front to rear pillar spacing distance 110. That is, the first and second rail members 128, 132 may be locked against relative sliding motion at a longitudinal position such that the rail assembly 126 may engage the front and rear vertical pillar members 112, 116 at the first and second mounting tabs 130, 134, respectively.

Turning next to FIGS. 2A-2E, the rail assembly 126 is depicted according to various expanded assembly views with respect to the embodiments disclosed herein. As previously stated, the rail assembly 126 may include first rail member 128 with first mounting tab 130 and second rail member 132 with second mounting tab 134. Additionally, the rail assembly 126 may include one or more locking systems 133 that each locks the first and second rails members 128, 132 against slidable movement despite any dimensional variations in the front to rear pillar spacing distances 110. For example, the first rail member 128 may include a first body 129 through which a first mounting aperture 136a of the locking system 133 extending through the first body 129 may be disposed. In some instances, the locking system 133 may include a second mounting aperture 136b extending through the first body 129 and disposed in corresponding relation to the first mounting aperture 136a. In this regard, the second rail member 132 may include a second body 131 through which a first mounting slot 138a of the locking system 133 extending through the second body 131 for a pre-defined dimension 139 along a longitudinal axis 140 may be disposed. In some instances, the second rail member 132 may include a second mounting slot 138b and a third mounting slot 138c, both extending through the second body 131 and disposed in corresponding relation to the first mounting slot 138a (e.g., such as where the first, second and third mounting slots 138a, 138b, 138c are parallel to each other).

The first and second rail members 128, 132 may slidably attach to each other in order to provide structural support for the computing devices 108 over the rail assembly length 127. In this regard, according to one embodiment, the first rail member 128 may include a substantially C-shaped channel and the second rail member 132 may include a substantially U-shaped channel. As depicted with respect to FIG. 2C, the substantially C-shaped channel of the first rail member 128 may be received by the substantially U-shaped channel of the second rail member 132 such that the first and second rail members 128, 132 may slide with respect to each other along the longitudinal axis 140.

Figure 2A:
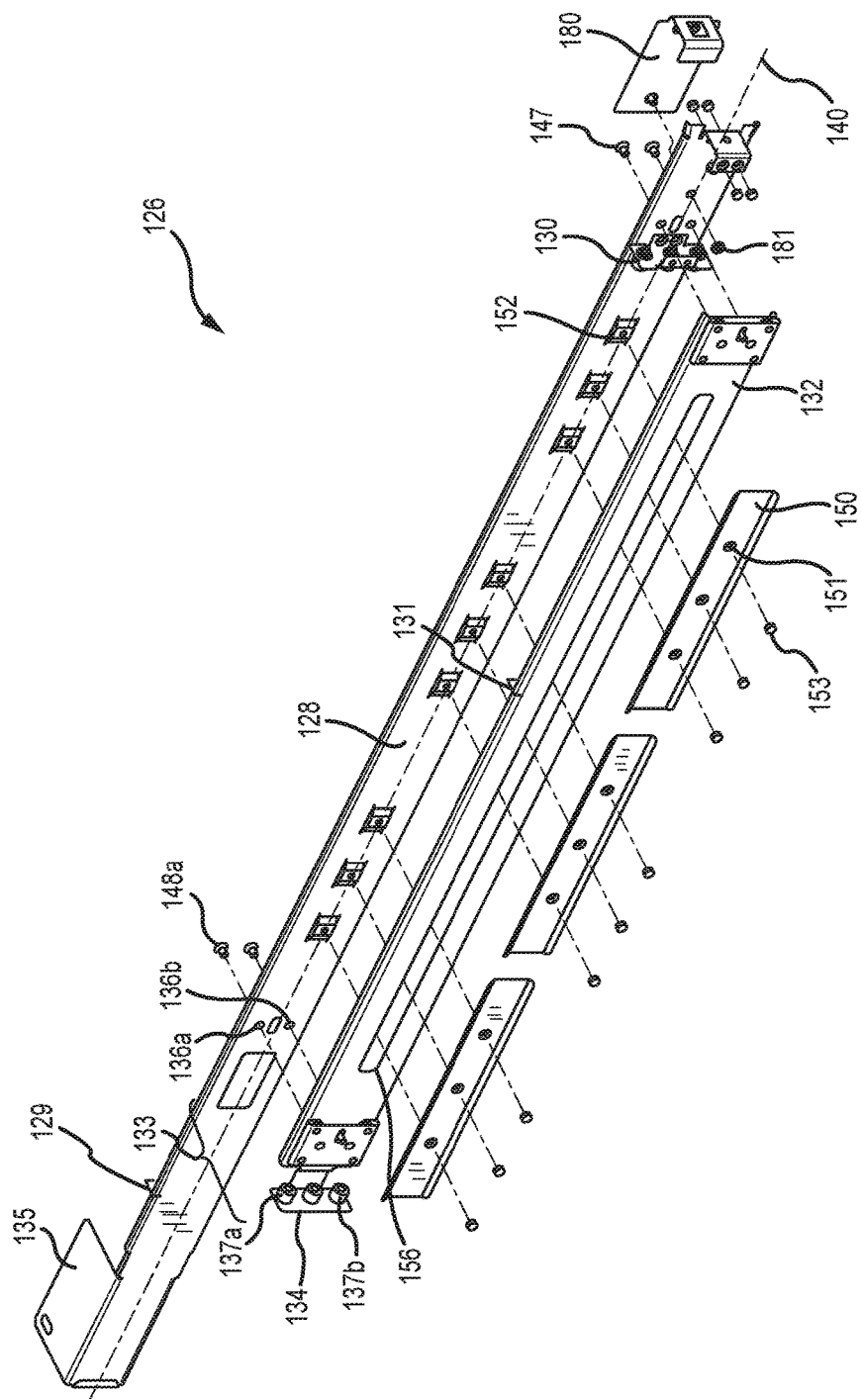
FIGS. 2A-2E depict expanded assembly views of various embodiments of a rail assembly.
Figure 2B:
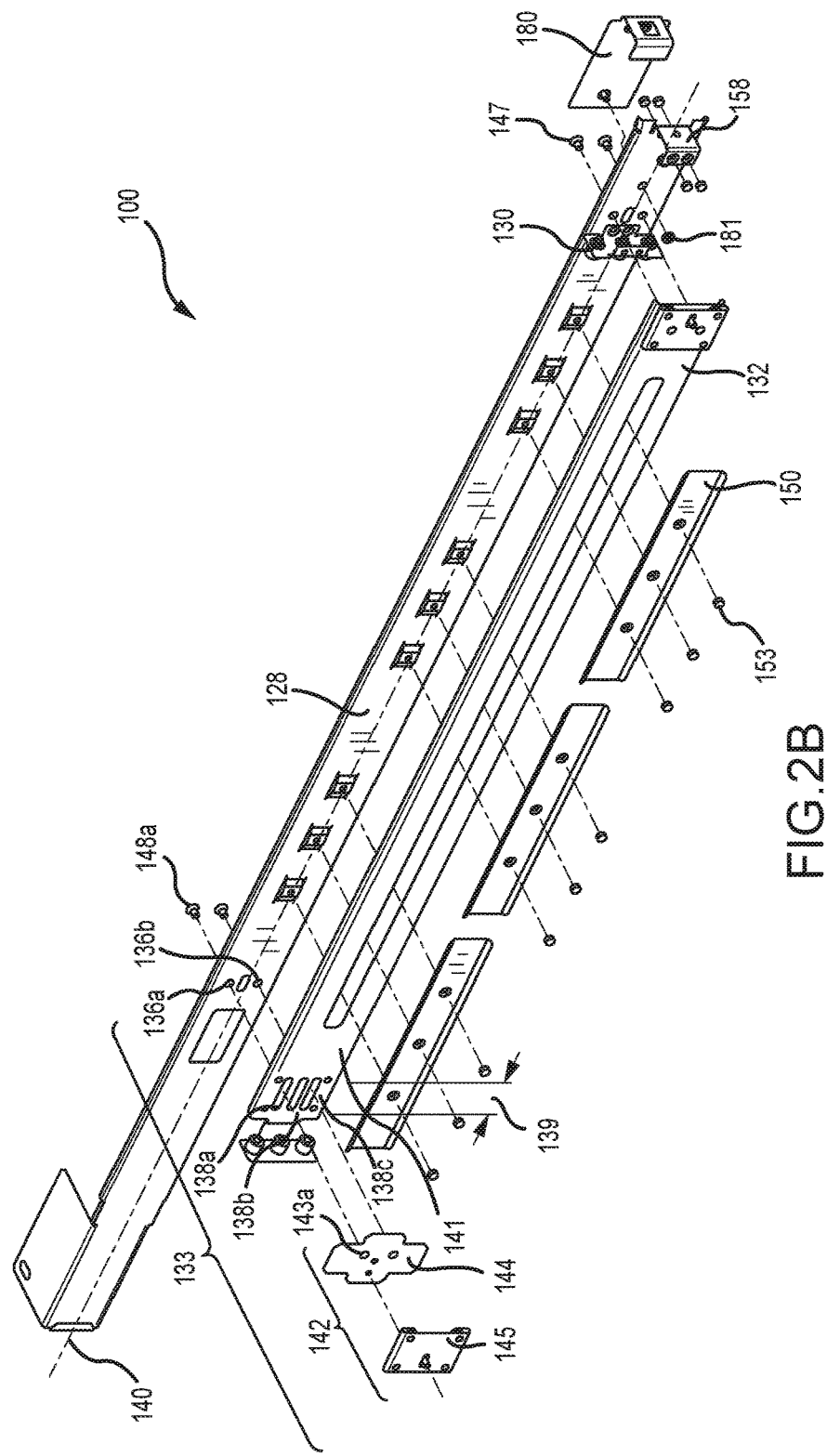
Figure 2C:
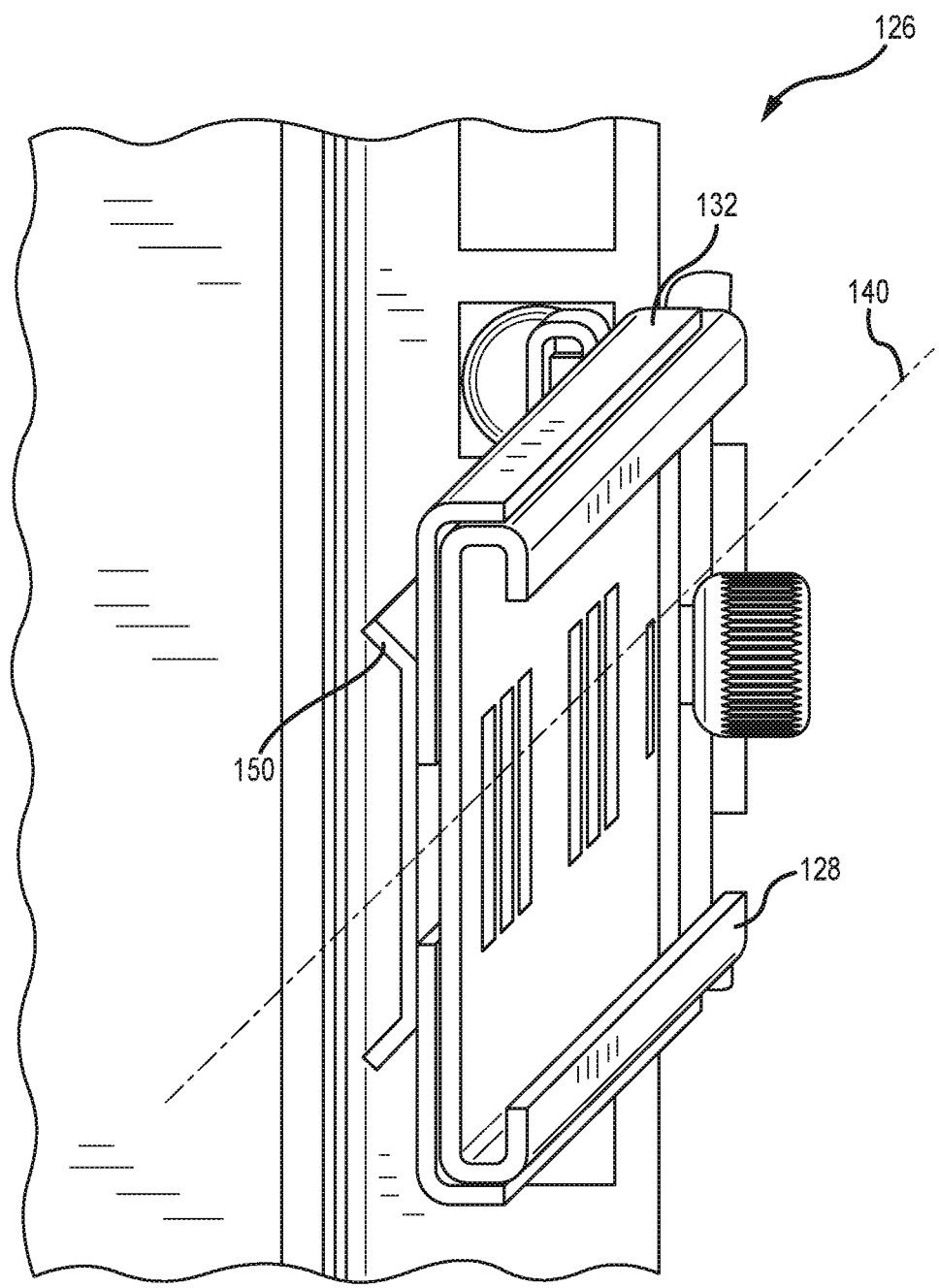
Figure 2D:
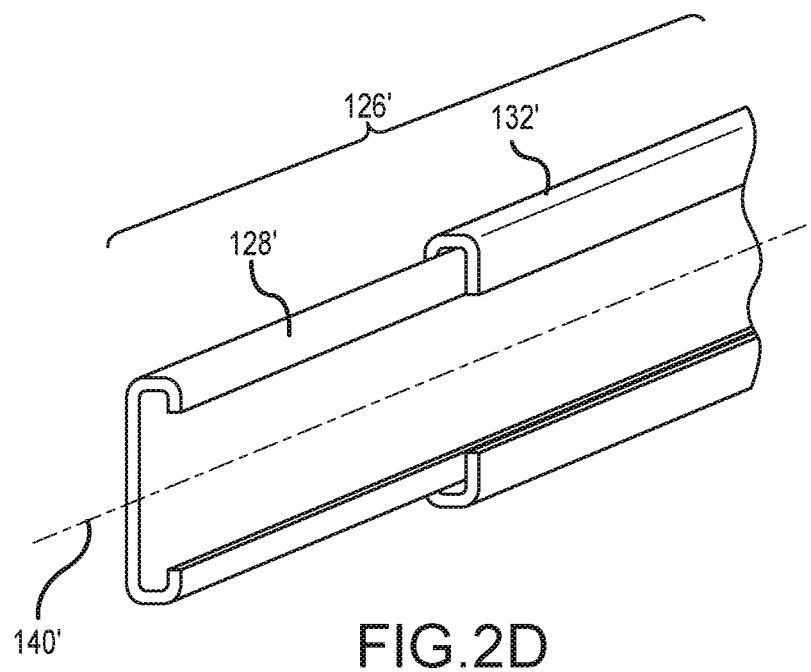

In other embodiments, as depicted in FIG. 2D, a rail assembly 126' may include a first rail member 128' and a second rail member 132'. In this regard, the first rail member 128' may include a substantially C-shaped channel and the second rail member 132' may also include a substantially C-shaped channel. As depicted with respect to FIG. 2D, the substantially C-shaped channel of the first rail member 128' may be received by the substantially C-shaped channel of the second rail member 132' such that the first and second rail members 128', 132' may slide with respect to each other along the longitudinal axis 140'. Notably, however, the substantially C-shaped channel of the second rail member 132' may restrict the relative movement of the first rail member 128' along an axis transverse to the axis 140' (e.g., a z or vertical axis).

With return reference to the rail assembly 126 depicted in FIGS. 2A-2C, the first rail member 128 may include one or more components to facilitate structurally supporting the computing devices 108. For example, the C-shaped channel of the first rail member 128 may facilitate receiving the computing device 108 (e.g., by receiving wheels, rollers, and/or any other sliding/rolling mechanism of or associated with a computing device 108 within the C-shaped channel, etc.). Additionally, the first rail member 128 may include a rear flange 135. The rear flange 135, for example, may facilitate structurally supporting the computing device 108 in the area beyond rear vertical pillar member 116 (e.g., in a region between the rear vertical pillars 116 and the rear access opening 124). The first rail member 128 may also include a front mounting bracket 158. In some instances, the front mounting bracket 158 may be configured to engage with an adapter piece 180 and/or via adapter fastener 181. In some implementations, adapter piece 180 may be operable to attach or otherwise be associated with a server blank (not pictured) (e.g., for use in concealing the volume of the storage rack 104 when the computing device 108 is not being supported by the rail assembly 126).

As noted above, the rail assembly 126 may provide structural support for the computing devices 108 via the engagement of the first and second rail members 128, 132 with front and rear vertical pillar members 112, 116 (e.g., via first and second mounting tabs 130, 134). In this regard, the first and second mounting tabs 130, 134 may include one or more tab connectors such as top and bottom tab connectors 137a, 137b that are configured to be slidably received into corresponding apertures in the front and rear vertical pillar members 112, 116 along or in a direction parallel to the longitudinal axis 140. For instance, each connector 137a, 137b may be in the form of a cylindrical (as shown) or other shaped protrusion (e.g., square-shaped, etc.) having a substantially smooth outer surface to facilitating sliding insertion of the connector 137a, 137b into the front or rear pillar member 137a, 137b. In one arrangement, each connector 137a, 137b may include a threaded fastener that may be threaded into the first or second mounting tab 130, 134 to secure the connector 137a, 137b thereto.

Figure 2E:
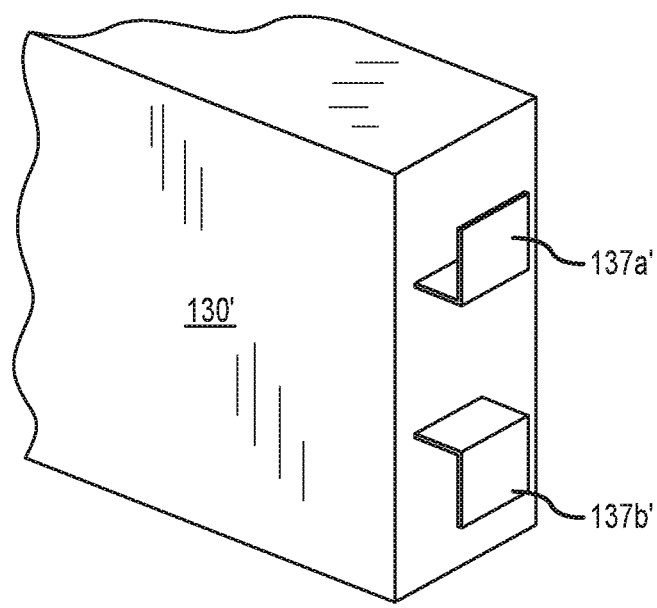

In other embodiments, as depicted in FIG. 2E, the rail assembly 126' may include, for example, a first mounting tab 130'. The first mounting tab 130' may include top and bottom tab connectors 137a', 137b' configured to engage the front or rear vertical pillar members 112, 116. Notably, however, the top and bottom tab connectors 137a', 137b' may include L-shaped bracket members. The L-shaped bracket member may be lifted into an opening of the front or rear vertical pillar member 112, 116 such that a portion of the L-shaped bracket transverse to the longitudinal axis 140 is disposed within an internal volume of the front or rear vertical pillar member 112, 116. Accordingly, in an installed configuration, a portion of the L-shaped bracket parallel to the longitudinal axis 140 may be disposed for structural support of the rail assembly 126 via attachment to the front or rear vertical pillar members 112, 116. In some implementations, the top and bottom tab connectors 137a', 137b' may be symmetrically disposed on the first mounting tab 130' such that the rail assembly may be "flipped" for operative mounting on either side (e.g., left or right side) of the storage rack 104.

With return reference to the rail assembly 126 depicted in FIGS. 2A-2C, the rail assembly 126 may further include one or more securing plates 150 to facilitate the slidable attachment of the first and second rail members 128, 132 to each other. Each securing plate 150 may be disposed in adjacent contactable relation with the second rail member 132 and fixedly engaged with the first rail member 128 such that the U-shaped channel of the second rail member 132 receives the C-shaped channel of the first rail member 128 while the first and second rail members 128, 132 slide relative to each other along the longitudinal axis 140 (see FIG. 2C). According to one embodiment, the first rail member 128 may include one or more protrusion pieces 152 for receipt of an elongated channel 156 of the second rail members 132 and alignment with a securing plate hole 151 extending through the securing plate 150.

In one arrangement, the elongated channel 156 may extend through the second body 131 of the second rail member 132 along the longitudinal axis 140 over a predefined dimension greater than the dimension of the securing plate 150 along the longitudinal axis 140. The securing plate 150 may therefore be disposed with respect to the second rail member 132 such that a securing plate fastener 153 (e.g., a rivet, screw, or the like) may be received through the securing plate hole 151 and the elongated channel 156 for attachment with the protrusion piece 152. In this regard, in an installed configuration, upon the attachment of the securing plate fastener 153 with the protrusion piece 152, the first and second rail members 128, 132 may be disposed in adjacent contactable relationship in a manner that allows for the first second rail members 128, 132 to slide with respect to each other along the longitudinal axis 140. In some instances, a plurality of securing plates 152, each with one or more holes 151 for alignment with one or more protrusion pieces 152, may be disposed with respect to the second rail member 132 to facilitate the foregoing.

The locking system 133 may further include a sliding nut assembly 142 mounted adjacent to a first side 141 of the first mounting slot 138a to facilitate the selective locking of the second rail member 132 relative to the first rail member 128 against relative slidable motion at a position along the longitudinal axis 140 in which the first and second mounting tabs align with the front to rear pillar spacing distance 110. Initially, the first and second rail members 128, 132 may be slidably manipulated relative to each other such that the first mounting tab 130 of the first rail member 128 engages with the front vertical pillar member 112 and the second mounting tab 134 of the second rail member 132 engages with the rear vertical pillar member 116. Such slidable manipulation of the first and second rail members 128, 132 may result in the distance between the first and second mounting tabs 130, 134 equaling the front to rear pillar spacing distance 110. Thereafter, use of the sliding nut assembly 142 may facilitate locking the first and second rail members 128, 132 against relative sliding motion notwithstanding the variation in the front to rear pillar spacing distance 110, as discussed in greater detail below. In some instances, the second rail member 132 may include a plurality of sliding nut assemblies (e.g., disposed on opposite ends of the second rail member 132 to facilitate the foregoing locking).

To facilitate the foregoing, a portion of the sliding nut assembly 142 may remain fixed with respect to the second rail member 132 while a portion of the sliding nut assembly 142 may slide in adjacent relation to the second rail member 132. With additional reference to FIGS. 3-4, the sliding nut assembly 142 may include a first nut 143a, a carrier 144, a guide member 145, and pin 146. According to the embodiment as depicted in FIG. 2B, the guide member 145 may be fixedly (e.g., not movably) attached to the body 131 of the second rail member 132 (e.g., via one or more a guide member fasteners 176, see FIG. 5). In turn, the carrier 144, including the first nut 143a fixedly disposed therein, may be received by a channel of the guide member 145 and slidably mounted (e.g., slid in adjacent relation thereto) with respect to the body 131 of the second rail member 132 (e.g., adjacent and over the first side 141 of the first mounting slot 138a).

Accordingly, one or more carrier fasteners 148a may be received through the first mounting aperture 136a and the first mounting slot 138a, for example, and threaded into the first nut 143a in order to lock the first and second rail members 148, 132 against relative sliding motion (i.e., to inhibit sliding movement of the first and second bodies 129, 131 relative to each other and inhibit sliding movement of the first nut 143a relative to the second body 131). In this regard, the carrier 144 may be slidably positioned along the longitudinal axis 140 relative to the first side 141 of the slot 138a such that the first nut 143a is disposed in concentric relation to the first mounting aperture 136a. As such, the positioning of the carrier 144 along the longitudinal axis 140 allows the first and second rail members 128, 132 to be locked together over a range of distances corresponding to the variation in the front to rear vertical pillar spacing distance 110 (e.g., the rail assembly 126 may accommodate dimensional variation in the front to rear pillar spacing distance 110 in part by positioning the carrier 144 at various positions along the longitudinal axis 140 in relation to the first mounting slot 138a).

Figure 3:
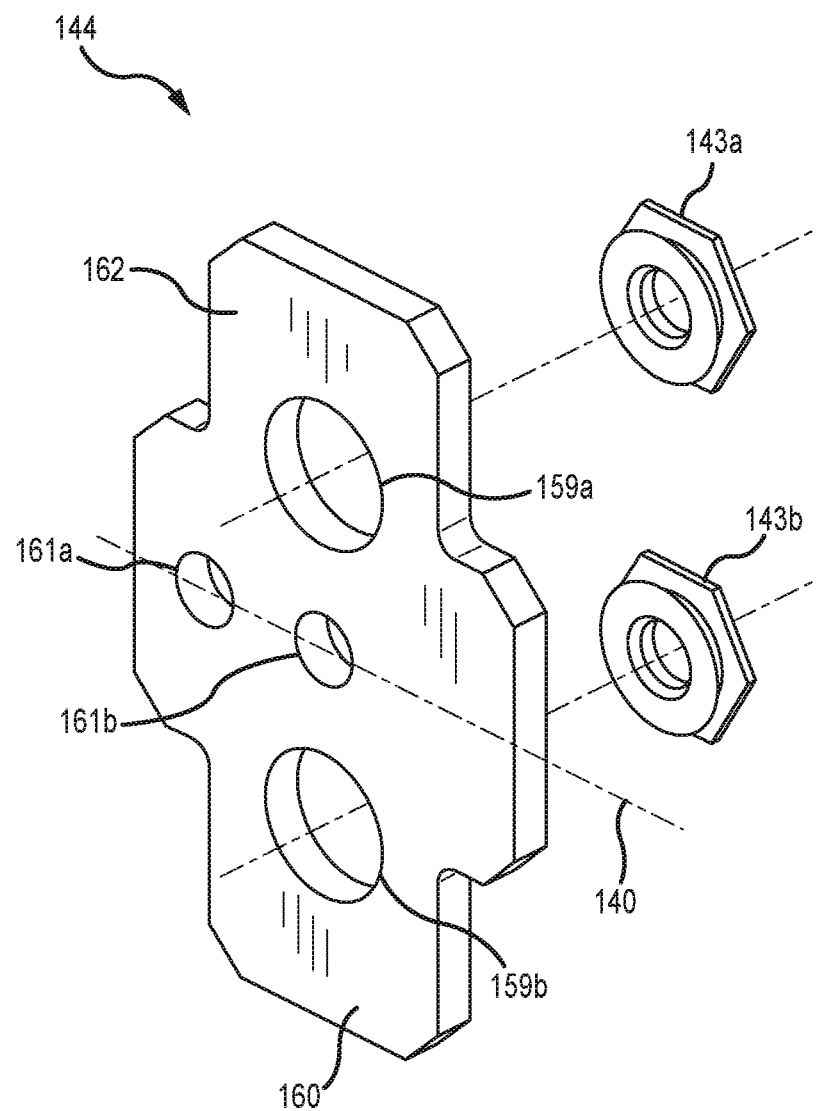
FIG. 3 depicts an expanded assembly view of an embodiment of a carrier for use with a rail assembly.

Turning next to FIG. 3, the carrier 144 is depicted in greater detail. The carrier 144 may include first and second sliding members 160, 162 integrally formed with the carrier 144 and extending opposite each other along an axis transverse from the longitudinal axis 140. In this regard, the first and second sliding members 160, 162 may facilitate the slidable travel of the carrier 144 relative to the first mounting slot 138a. As previously noted, the carrier 144 may include the first nut 143a. In some embodiments, the carrier 144 may also include a second nut 143b operable for slidable travel with respect to the second rail member 132 analogous to first nut 143a. The first nut and second nut 143a, 143b may be received by the carrier 144 at first and second nut apertures 159a, 159b, respectively. The carrier 144 may also include pin recess 161a extending through the carrier 144 and configured to receive the pin 146. In some embodiments, the carrier 144 may include alignment recess 161b to facilitate the slidable travel of the carrier 144 along the longitudinal axis 140 via manipulation of the alignment recess 161b. As just one example, a user may initially extend a tool (e.g., screwdriver, etc.) through an opening in the first rail member 128 (e.g., such as the slot between first and second mounting apertures 136a, 136b in FIG. 2B) and an opening in the second rail member 132 (e.g., such as second mounting slot 138b) and into the alignment recess 161b. The user may then laterally move the tool to slidably position the carrier 144 along the longitudinal axis 140 so as to align first nut 143a with the first mounting aperture 136a.

Figure 4:
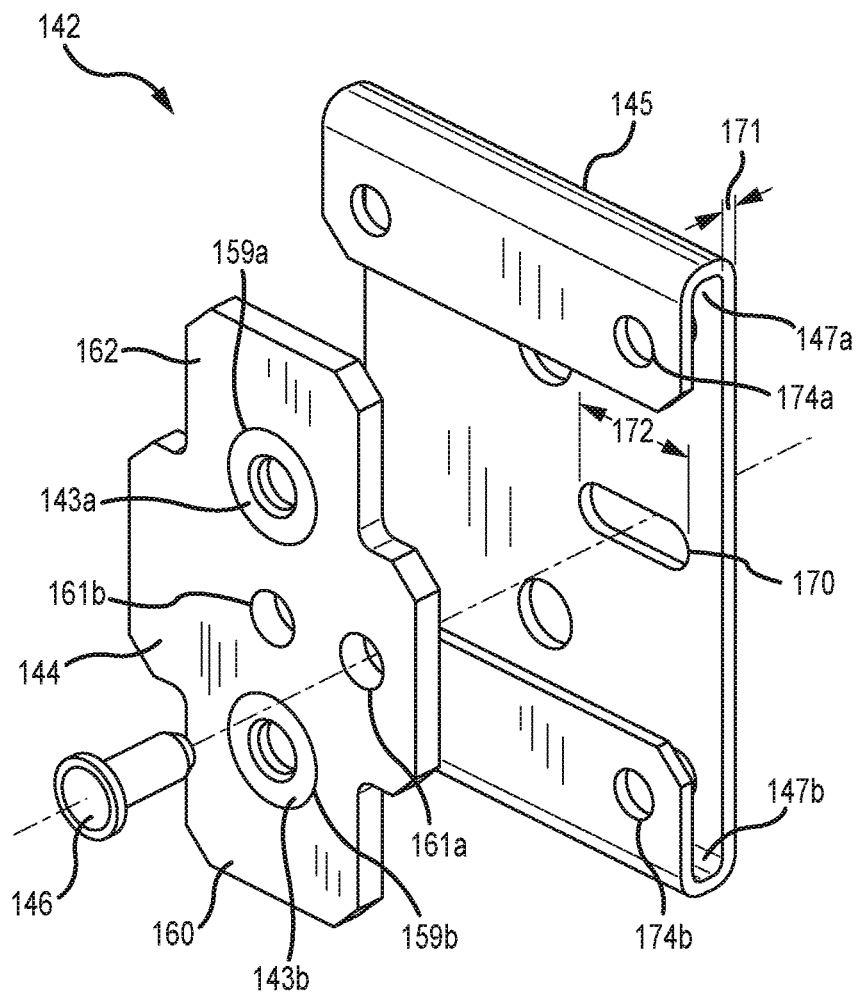
FIG. 4 depicts an expanded assembly view of an embodiment of a sliding nut assembly for use with a rail assembly.

With reference to FIG. 4, the sliding nut assembly 142 is depicted. As previously stated, the sliding nut assembly 142 may include at least guide member 145, carrier 144, pin 146, and first nut 143a. The guide member 145 may include a substantially C-shaped channel member, as depicted according to the embodiment of FIG. 4. In this regard, the guide member 145 may include first and second guiding tracks 147a, 147b disposed on opposing ends of the guide member 145. According to one embodiment, the guide member 145 may be operable to receive the carrier 144 via the first and second guiding tracks 147a, 147b such that the first and second sliding members 160, 162 of the carrier 144 are received by the first and second guiding tracks 147a, 147b, respectively. In this regard, the carrier 144 may slidably travel with respect to the guide member 145 along the longitudinal axis 140 (i.e., the first and second guiding tracks 147a, 147b may be disposed in corresponding parallel relation with the longitudinal axis 140 such that the slidable travel of the carrier 144 is limited to movement along the longitudinal axis 140). The external surface of each of the first and second guiding tracks 147a, 147b may include corresponding first and second guide member apertures 174a, 174b to facilitate the fixed attachment of the guide member 145 to the second rail member 132, as will be discussed in greater detail below.

The guide member 145 may also include at least one guide member slot 170 extending through a body 171 of the guide member 145 to constrain the slidable travel of the carrier 144 and associated first nut 143a to a predefined linear range that is substantially equal to (e.g., but less than) a length 172 of the guide member slot 170. In some instances, the predefined linear range may substantially correspond to the length of the first mounting slot 138a (e.g., to facilitate the slidable travel of the carrier 144 with respect to the second rail member 132). For example, in an installed configuration, pin 146 may be received by, for example, pin recess 161a and the guide member slot 170. Accordingly, the pin 146 may extend through the pin recess 161a and the guide member slot 170 such that at least a portion of the pin 146 extends beyond the guide member body 171. See FIGS. 2A-2B. The pin 146 may slidably travel along the longitudinal axis 140 within the guide member slot 170 over a distance generally corresponding to the difference between the length 172 of the guide member slot 170 and the diameter of the pin 146. In this regard, the pin 146 may restrict the slidable travel of the carrier 144 to a particular corresponding linear range.

Figure 5:
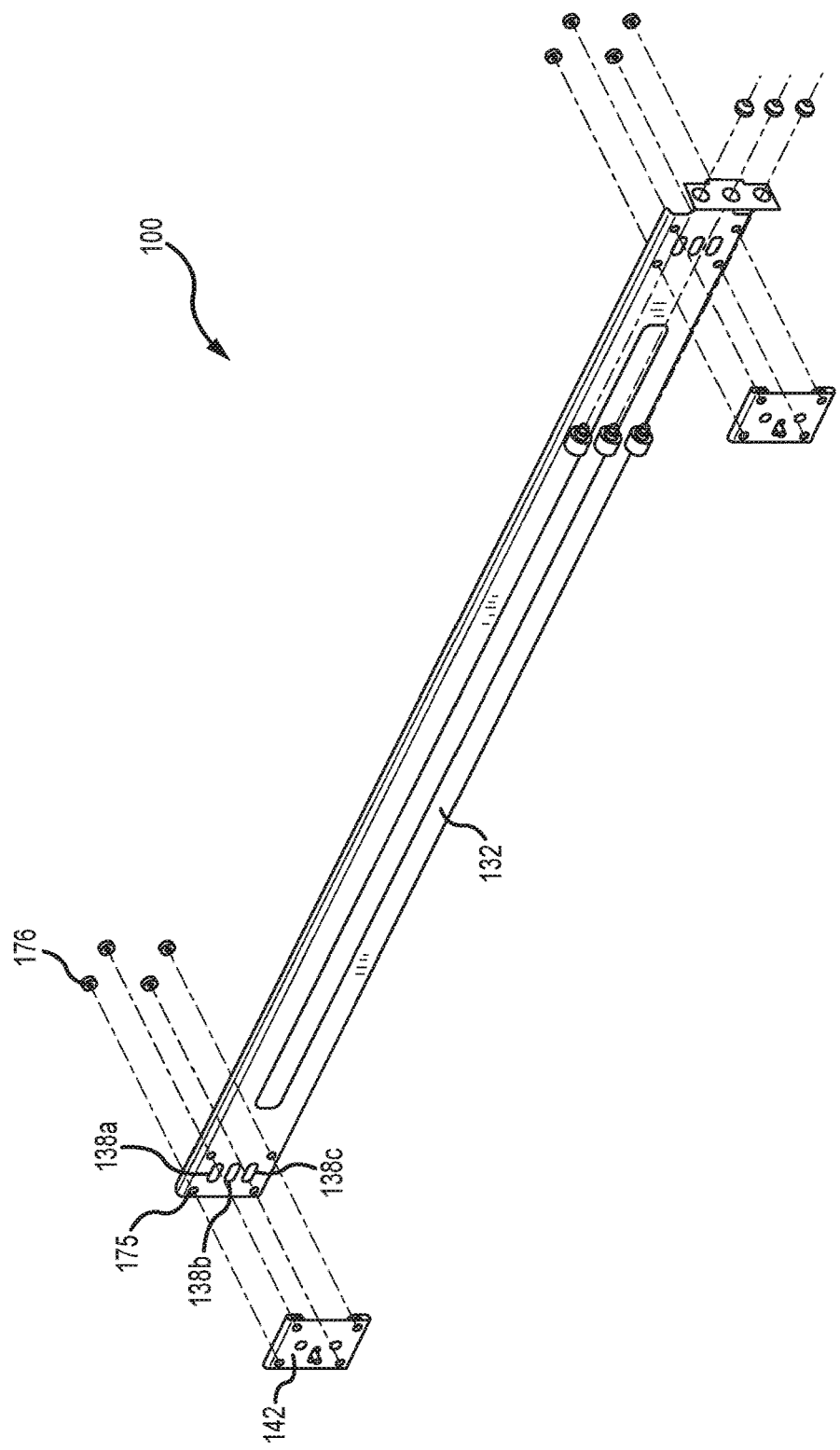
FIG. 5 depicts an expanded assembly view of an embodiment of a second rail member and a sliding nut assembly for use with a rail assembly.

Turning next to FIG. 5, the sliding nut assembly 142 is depicted with respect to second rail member 132. As previously stated, the sliding nut assembly 142 may be mounted with respect to the first side 141 of the first mounting slot 138a. In this regard, the sliding nut assembly 142 may be mounted with respect to the second rail member 132 such that the guide member 142 is fixedly attached to the body 131 of the second rail member 132 while the carrier 144 is slidable with respect to the first side 141 of the first mounting slot 138a as well as the second body 131. To facilitate the foregoing, one or more guide member fasteners 176 may be received by a guide member passage 175 and threaded, for example, into the guide member aperture 174a. As such, the guide member 145 may be fixedly attached to the second rail member 132 while permitting the slidable travel of the carrier 144 along the longitudinal axis 140 over a range generally equal to the difference between the length 172 of the guide member slot 170 and the diameter of the pin 146.

Figure 6:
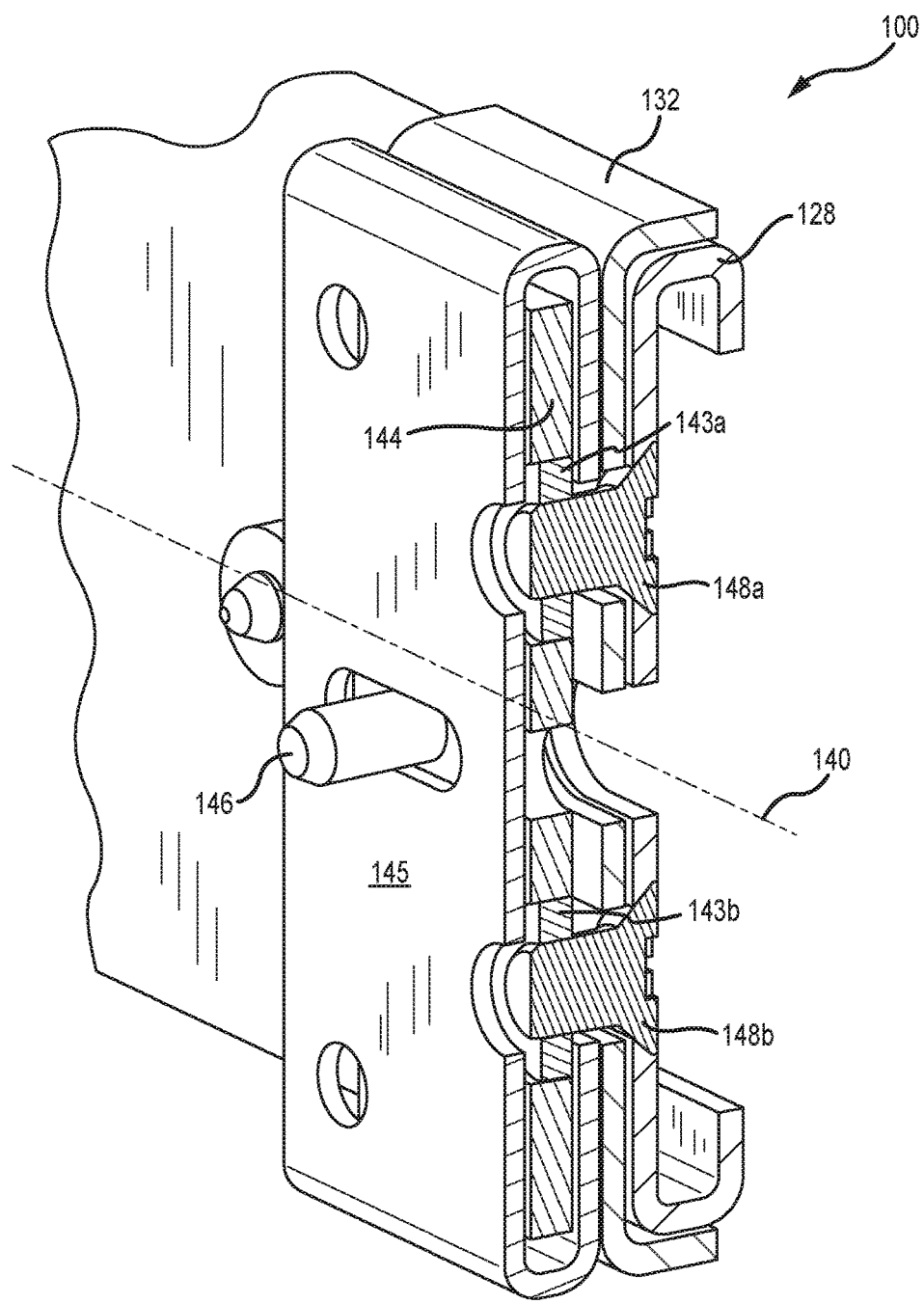
FIG. 6 depicts a cross-sectional view of an embodiment of a rail assembly.

In this regard, with reference to FIGS. 2A-2B and 6, the fixed attachment of the guide member 145 to the second rail member 132 may align, for example, the first nut 143a with the first mounting slot 138a along the longitudinal axis 140. The pin 146 may therefore be manipulated along the longitudinal axis 140 (which, in turn, manipulates the first nut 143a along the longitudinal axis 140) such that the first nut 143a can be aligned by a user in concentric relation with the first mounting aperture 136a. In this regard, the pin 146 may be manipulated such that, for example, the carrier fasteners 148a may be received by the first mounting aperture 136a and the first mounting slot 138a and be threaded with the first nut 143a. As such, the first and second rail members 128, 132 may be locked against relative motion at a point along the longitudinal axis 140 corresponding to the concentric alignment of the first mounting aperture 136a and the first nut 143a with at least a portion of the first mounting slot 138a. Stated differently, the first and second rail members 128, 132 may be locked against relative slidable motion at a position along the longitudinal axis 140 in which the first and second mounting tabs align with the front to rear pillar spacing distance 110. Accordingly, the rail assembly 126 may accommodate a range of dimensional variations in the front to rear pillar spacing 110 due in part to the slidable manipulation of the first nut 143a (e.g., via the pin 146 fixedly attached to the carrier 144) into a position along the longitudinal axis 140 that aligns with the first mounting aperture for the locking of the first and second rail members 128, 132.

Figure 7:
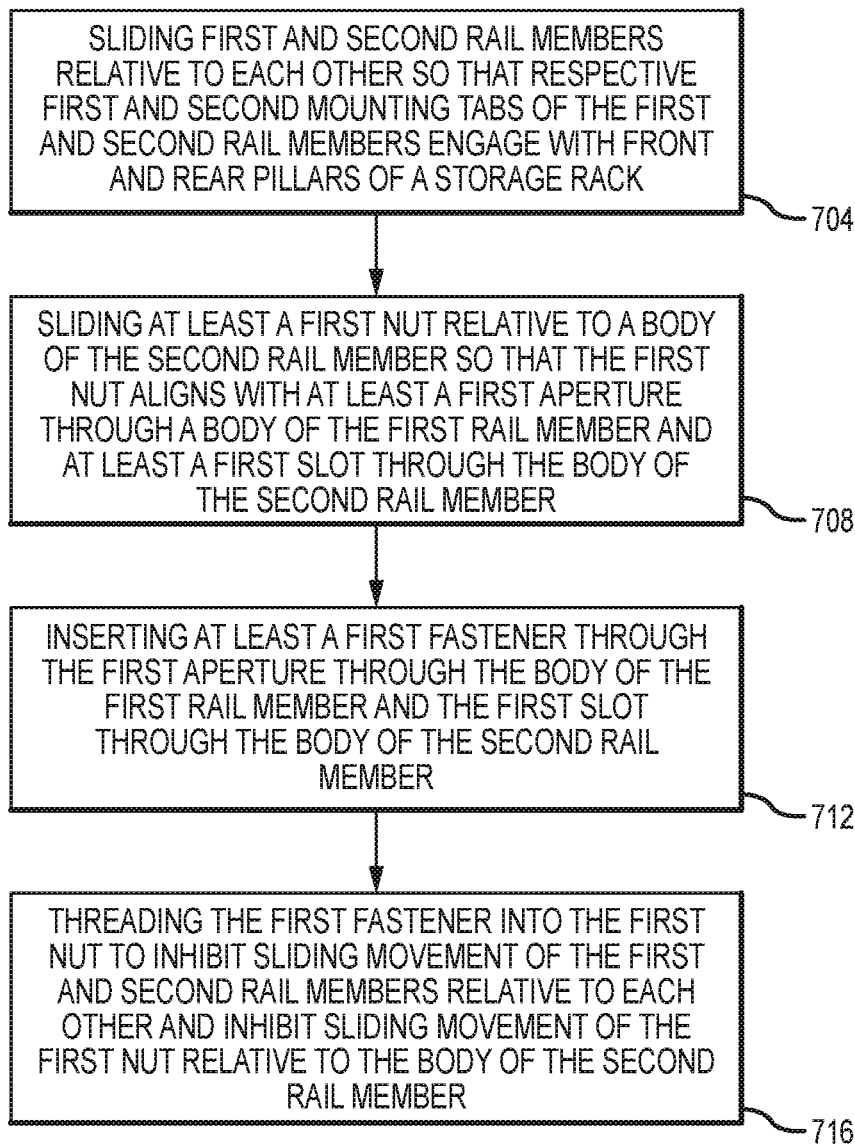
FIG. 7 illustrates a flow diagram of an embodiment of a method for mounting a rail assembly onto front and rear pillars of a storage rack.

To facilitate the reader's understanding of the various functionalities of the utilities discussed herein, reference is now made to flow diagrams in FIG. 7, which illustrates a method 700, for use in mounting a rail assembly onto front and rear pillars of a storage rack. While specific steps (and orders of steps) of the method 700 will be illustrated and discussed, other methods (including more, fewer, or different steps those illustrated) consistent with the teachings presented herein are also envisioned and encompassed in the present disclosure.

With reference to FIG. 7, method 700 relates generally to mounting a rail assembly on the front and rear pillars of a storage rack. In this regard, the method 700 may include sliding 704 first and second rail members (e.g., first and second rail members 128, 132) relative to each other so that respective first and second mounting tabs (e.g., first and second mounting tabs 130, 134) of the first and second rail members engage with front and rear pillars (e.g., front and rear vertical pillar members 112, 116) of a storage rack (e.g., storage rack 104). In this regard, the first and second rail members may span a distance (e.g., front to rear pillar spacing distance 110) between the front and rear pillars of the storage rack. The method 700 may continue by sliding 708 at least a first nut (e.g., first nut 143a) relative to a body (e.g., body 131) of the second rail member so that the first nut aligns with at least a first aperture (e.g., first mounting aperture 136a) through a body (e.g., body 129) of the first rail member and at least a first slot (e.g., first mounting slot 138a) through the body of the second rail member.

The method 700 may continue by inserting 712 at least a first fastener (e.g., carrier fastener 148a) through the first aperture through the body of the first rail member and the first slot through the body of the second rail member. The method 700 may continue by threading 716 the first fastener into the first nut to inhibit sliding movement of the first and second rail members relative to each other and inhibit sliding movement of the first nut relative to the body of the second rail member. In this regard, according to one embodiment the first nut may slidably travel with respect to the first mounting slot such that the first nut and the first mounting aperture are disposed in concentric relation for receipt and threading, respectively, of the fastener. In some instances, a second nut (e.g., second mounting nut 143b) may be slid relative to the body of the second rail member so that the second nut aligns with a second aperture (e.g., second mounting aperture 136b) through the body of the first rail member and a second slot (e.g., second mounting slot 138c) through the body of the second rail member. Analogously, a second fastener (e.g., second carrier fastener 148b) may be inserted through the second aperture through the body of the first rail member and the second slot through the body of the second rail member in order to inhibit the sliding movement of the first and second rail members relative to each other. According to one embodiment, the first and second nuts may be mounted on a carrier member (e.g., carrier 144) that is slidably attached to the body of the second rail member.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

We claim:

1. A method of mounting a rail assembly onto front and rear pillars of a storage rack, including:
   sliding first and second rail members relative to each other so that respective first and second mounting tabs of the first and second rail members engage with front and rear pillars of a storage rack;
   sliding at least a first nut relative to a body of the second rail member so that the first nut aligns with at least a first aperture through a body of the first rail member and at least a first slot through the body of the second rail member;
   inserting at least a first fastener through the first aperture through the body of the first rail member and the first slot through the body of the second rail member;
   threading the first fastener into the first nut to inhibit sliding movement of the first and second rail members relative to each other and inhibit sliding movement of the first nut relative to the body of the second rail member;
   sliding a second nut relative to the body of the second rail member so that the second nut aligns with a second aperture through the body of the first rail member and a second slot through the body of the second rail member;
   inserting a second fastener through the second aperture through the body of the first rail member and the second slot through the body of the second rail member; and
   threading the second fastener into the second nut to inhibit sliding movement of the first and second rail members relative to each other and inhibit sliding movement of the second nut relative to the body of the second rail member, wherein one of:
   i) the first and second nuts are mounted on a carrier member that is slidably attached to the body of the second rail member, and wherein the steps of sliding the first and second nuts includes sliding the carrier member, or
   ii) the first nut is mounted on a first carrier member that is slidably attached to the body of the second rail member, wherein the second nut is mounted on a second carrier member that is slidably attached to the body of the second rail member, and wherein the steps of sliding the first and second nuts includes sliding the first and second carrier members.

2. The method of claim 1, wherein the steps of sliding the first and second nuts occur simultaneously.

3. A method of mounting a rail assembly onto front and rear pillars of a storage rack, including:
   sliding first and second rail members relative to each other so that respective first and second mounting tabs of the first and second rail members engage with front and rear pillars of a storage rack;
   sliding at least a first nut relative to a body of the second rail member so that the first nut aligns with at least a first aperture through a body of the first rail member and at least a first slot through the body of the second rail member;
   inserting at least a first fastener through the first aperture through the body of the first rail member and the first slot through the body of the second rail member; and
   threading the first fastener into the first nut to inhibit sliding movement of the first and second rail members relative to each other and inhibit sliding movement of the first nut relative to the body of the second rail member, wherein the first nut is mounted on a carrier member that is slidably attached to the body of the second rail member, wherein the step of sliding the first nut includes sliding the carrier member, wherein the carrier member is slidably mounted within a guide member that is rigidly fixed to the body of the second rail member, and wherein the step of sliding the carrier member includes sliding the carrier member within the guide member.

4. The method of claim 3, wherein the step of sliding the carrier member within the guide member includes manipulating a pin that extends through an aperture in the carrier member and a slot in the guide member, wherein sliding of the pin within the slot restricts sliding travel of the carrier member relative to the body of the second rail member to a predetermined range.

5. The method of claim 4, wherein a length of the slot of the guide member is approximately equal to a length of the first slot of the body of the second rail member.

6. A storage rack for supporting computing devices, including:
   a plurality of front vertical support pillars;
   a plurality of rear support pillars that are spaced from the plurality of front support pillars; and
   a plurality of rail assemblies for receiving computing devices, wherein each rail assembly interconnects one of the front vertical support pillars to one of the rear vertical support members, and wherein each rail assembly comprises:
   a first rail member having a first body that is slidably mounted to a first side of a second body of a second rail member; and
   a sliding nut assembly mounted to an opposite second side of the second body of the second rail member, wherein the first side of the second body faces in a first direction, wherein the second side of the second body faces in a second direction, wherein the first direction is opposite to the second direction, and wherein the sliding nut assembly includes:
   a guide member that is rigidly attached to the second side of the second body and that extends away from the second side in the second direction;
   a carrier member including a first nut attached thereto, wherein the carrier member is slidable relative to the guide member to slidably position the first nut along the second side of the second body.

7. The storage rack of claim 6, wherein the guide member includes at least one slot therethrough that extends along a longitudinal axis, wherein the carrier member includes at least one aperture therethrough that is configured to slide over the at least one slot of the guide member along the longitudinal axis thereof, and wherein the sliding nut assembly further includes a pin received through the at least one aperture of the carrier member and the at least one slot of the guide member to constrain sliding movement of the at least one nut to a predefined linear range that substantially corresponds to a length of the at least one slot of the second body along the longitudinal axis thereof.

8. The storage rack of claim 7, further including:
a first mounting aperture extending through the first body;
a first mounting slot extending through the second body; and
at least one fastener receivable through the first aperture and the first mounting slot and into the first nut to selectively inhibit sliding movement of the first and second bodies relative to each other and inhibit sliding movement of the first nut relative to the second body.

9. The storage rack of claim 8, wherein a length of the slot of the guide member is approximately equal to a length of the first mounting slot of the second body.

10. The storage rack of claim 7, wherein the second body includes at least one slot therethrough, and wherein the carrier member is slidable relative to the guide member to slidably position the first nut over the slot through the second body.

11. The storage rack of claim 10, wherein the at least one slot through the second body is spaced from the at least one slot through the guide member.

12. The storage rack of claim 6, wherein the second body includes at least one slot therethrough, and wherein the carrier member is slidable relative to the guide member to slidably position the first nut over the slot through the second body.

13. The storage rack of claim 6, wherein the carrier member is slidable relative to the guide member to slidably position the first nut relative to the first body.

14. The storage rack of claim 6, wherein the first nut is non-movable relative to the carrier member.

15. A storage rack for supporting computing devices, including:
a plurality of front vertical support pillars;
a plurality of rear support pillars that are spaced from the plurality of front support pillars; and
a plurality of rail assemblies for receiving computing devices, wherein each rail assembly interconnects one of the front vertical support pillars to one of the rear vertical support members, and wherein each rail assembly comprises:
a first rail member having a first body that is slidably mounted to a first side of a second body of a second rail member; and
a sliding nut assembly mounted to an opposite second side of the second body of the second rail member, wherein the sliding nut assembly includes:
a guide member that is rigidly attached to the second side of the second body;
a carrier member including a first nut attached thereto, wherein the carrier member is slidable relative to the guide member to slidably position the first nut along the second side of the second body, wherein the guide member includes first and second guiding tracks, and wherein the carrier member includes first and second sliding members that are respectively slidably received in the first and second guiding tracks for sliding movement of the carrier member relative to the guide member.

16. A storage rack for supporting computing devices, including:
a plurality of front vertical support pillars;
a plurality of rear support pillars that are spaced from the plurality of front support pillars; and
a plurality of rail assemblies for receiving computing devices, wherein each rail assembly interconnects one of the front vertical support pillars to one of the rear vertical support members, and wherein each rail assembly comprises:
a first rail member having a first body that is slidably mounted to a first side of a second body of a second rail member; and
a sliding nut assembly mounted to an opposite second side of the second body of the second rail member, wherein the sliding nut assembly includes:
a guide member that is rigidly attached to the second side of the second body;
a carrier member including a first nut attached thereto, wherein the carrier member is slidable relative to the guide member to slidably position the first nut along the second side of the second body, further including:
a first mounting aperture extending through the first body;
a first mounting slot extending through the second body; and
at least one fastener receivable through the first aperture and the first mounting slot and into the first nut to selectively inhibit sliding movement of the first and second bodies relative to each other and inhibit sliding movement of the first nut relative to the second body.

* * * * *